(12) United States Patent
Matsukawa et al.

(10) Patent No.: US 8,872,684 B2
(45) Date of Patent: Oct. 28, 2014

(54) RESONANT FILTER, DELTA-SIGMA A/D CONVERTER, AND SEMICONDUCTOR DEVICE

(71) Applicant: Panasonic Corporation, Osaka (JP)

(72) Inventors: Kazuo Matsukawa, Osaka (JP); Yosuke Mitani, Kyoto (JP); Koji Obata, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/292,084

(22) Filed: May 30, 2014

(65) Prior Publication Data

US 2014/0266828 A1    Sep. 18, 2014

Related U.S. Application Data

(63) Continuation of application No. PCT/JP2012/002694, filed on Apr. 18, 2012.

(30) Foreign Application Priority Data

Dec. 22, 2011 (JP) ................................. 2011-282054

(51) Int. Cl.
*H03M 3/00* (2006.01)
*H03H 7/01* (2006.01)
*H03M 1/00* (2006.01)
*H03M 1/12* (2006.01)

(52) U.S. Cl.
CPC .............. *H03M 3/30* (2013.01); *H03H 7/0138* (2013.01); *H03M 1/00* (2013.01); *H03M 1/12* (2013.01)
USPC .......................................... 341/143; 341/120

(58) Field of Classification Search
CPC ............ H03M 3/30; H03M 1/12; H03M 1/00
USPC ........... 341/143, 155, 110, 120, 156; 375/344
See application file for complete search history.

(56) References Cited

U.S. PATENT DOCUMENTS

| 6,366,161 B1 | 4/2002 | Koazechi |
| 8,179,294 B2 * | 5/2012 | Karthaus et al. ............... 341/143 |
| 2006/0267698 A1 | 11/2006 | Erdogan et al. |

FOREIGN PATENT DOCUMENTS

| JP | 11-177379 A | 7/1999 |
| JP | 2008-054099 A | 3/2008 |
| JP | 2009-508384 A | 2/2009 |
| JP | 2011-061748 A | 3/2011 |

OTHER PUBLICATIONS

K. Matsukawa et al., "A. 69.8 dB SNDR 3rd-order Continuous Time Delta-Sigma Modulator with an Ultimate Low Power Tuning System for a Worldwide Digital TV-Receiver," IEEE Custom Integrated Circuits Conference (CICC) 2010 IEEE, pp. 1-4.
K. Matsukawa et al., "A Fifth-Order Continuous-Time Delta-Sigma Modulator With Single-Opamp Resonator," IEEE Journal of Solid-State Circuits, vol. 45, No. 4, Apr. 2010, pp. 697-706.
International Search Report issued in International Application PCT/JP2012/002694 mailed Jul. 17, 2012, with English translation.

* cited by examiner

*Primary Examiner* — Joseph Lauture
(74) *Attorney, Agent, or Firm* — McDermott Will & Emery LLP

(57) ABSTRACT

A delta-sigma A/D converter includes a loop filter including a resonant filter, a quantizer, and a feedback D/A converter. The resonant filter includes a resonator including a resistor and a capacitor, and a feedback path through which an output of the resonator is positively fed back to an input of the resonator. The resonant filter operates as an oscillator or a filter under the on/off control of a first switch. At least one of the resistor and the capacitor of the resonator is configured to allow a resistance value or a capacitance value thereof to be adjusted based on a third external signal.

9 Claims, 12 Drawing Sheets

RESONANT FILTER, DELTA-SIGMA A/D CONVERTER, AND SEMICONDUCTOR DEVICE

CROSS-REFERENCE TO RELATED APPLICATIONS

This is a continuation of International Application No. PCT/JP2012/002694 filed on Apr. 18, 2012, which claims priority to Japanese Patent Application No. 2011-282054 filed on Dec. 22, 2011. The entire disclosures of these applications are incorporated by reference herein.

BACKGROUND

The present disclosure relates to delta-sigma analog-to-digital (A/D) converters, and more particularly, to a resonant filter which can switch between filtering operation and oscillating operation.

In continuous-time delta-sigma A/D converters, an RC active filter including a resonant filter is often employed as the loop filter. However, the resistance value and the capacitance value of a resistor and a capacitor (hereinafter referred to as "the values of a resistor and a capacitor") which are included in the RC active filter vary due to manufacturing variations etc., and therefore, the filter characteristics of the RC active filter vary. The variations in filter characteristics cause a deterioration in the stability and signal-to-noise (S/N) ratio characteristics of the A/D converter.

To address the above problem, in general, for example, the frequency characteristics etc. of the RC active filter are directly measured using a measuring instrument to adjust the values of a resistor and a capacitor included in the RC active filter, in a manufacturing process, a testing process, etc. Specifically, for example, a delta-sigma A/D converter and an RC oscillator may be included together, the product of R and C may be obtained from the oscillation frequency of the RC oscillator, and based on the obtained RC product, the values of a resistor and a capacitor included in the RC active filter may be adjusted (see Kazuo Matsukawa, et al., "A 69.8 dB SNDR 3rd-order Continuous Time Delta-Sigma Modulator with an Ultimate Low Power Tuning System for a Worldwide Digital TV-Receiver," Custom Integrated Circuits Conference (CICC), 2010 IEEE (USA), 19-22 Sep. 2010, p. 1-4).

FIG. 12 is a diagram showing an example circuit configuration of a circuit in which a delta-sigma A/D converter and an RC oscillator are included together.

The delta-sigma A/D converter 900 includes a loop filter 901, a quantizer 904, and current-drive feedback D/A converters 905 and 906.

The loop filter 901 includes an integrator 902, and a resonant filter 903 in a stage following the integrator 902. The resonant filter 903 outputs differential output signals to the quantizer 904 through a resistor R93. The loop filter 901 feeds back the differential output signals to the respective corresponding differential inputs of the integrator 902 and the resonant filter 903 through respective corresponding resistors R91 and R92.

The differential signals input to the quantizer 904 are converted into a digital signal. The digital signal obtained by the conversion is fed back through the feedback D/A converters 905 and 906 as analog signals to the respective corresponding inputs of the quantizer 904, and the loop filter 901.

An RC oscillator 907 outputs an oscillating signal which oscillates at a predetermined oscillation frequency. A frequency measurement circuit 908 receives the oscillating signal from the RC oscillator 907, and measures a difference between the frequency or period of the oscillating signal and a preset oscillation frequency. A controller 909 obtains, based on the frequency or period difference received from the frequency measurement circuit 908, a deviation of the values of the resistor and the capacitor due to manufacturing variations etc., and outputs an RC tuning signal SC9 for adjusting the values of the resistor and the capacitor to the integrator 902 and the resonant filter 903. As a result, the deviation of the values of the resistor and the capacitor due to manufacturing variations etc. is adjusted (corrected).

SUMMARY

However, in order to directly measure the frequency characteristics etc. of the filter using a measuring instrument, it is necessary to extract input and output signals from the semiconductor device and measure the frequency characteristics etc., and therefore, it takes time to extract and measure the signal. Moreover, when the signal is extracted from the semiconductor device, an extra buffer for driving an external load, such as the measuring instrument etc., and an extra input or output terminal etc., are required.

In the technique of FIG. 12, it is necessary to provide an RC oscillator, which is not required for operation of the delta-sigma A/D converter and the RC active filter. Moreover, a mismatch occurs between a resistor and a capacitor which are included in the RC active filter including a resonant filter and a resistor and a capacitor which are included in the RC oscillator, resulting in a decrease in the accuracy of adjustment of the values of the resistor and the capacitor included in the RC active filter.

The present disclosure describes implementations of a technique of adjusting, with high accuracy, the values of a resistor and a capacitor included in a resonant filter and an RC active filter (including a resonant filter) used in a delta-sigma A/D converter, by using a small-scale additional circuit.

A delta-sigma A/D converter according to a first embodiment of the present disclosure includes a loop filter including a resonant filter and configured to receive a first input signal, a quantizer configured to convert an output of the loop filter into a digital signal, and a feedback D/A converter configured to convert an output of the quantizer into an analog signal and feed back the analog signal to the loop filter. The resonant filter includes a resonator including a resistor and a capacitor and configured to receive a second input signal, and a feedback path configured to connect an output of the resonator to an input of the resonator, in a positive feedback fashion, through a first switch configured to be switched on and off based on a first external signal and a feedback resistor configured to allow a resistance value thereof to be controlled based on a second external signal. The resonant filter operates as an oscillator when the first switch is controlled to be on and therefore the output of the resonator is positively fed back to the input of the resonator through the feedback path, and as a filter when the first switch is controlled to be off and therefore the feedback path is open. At least one of the resistor and the capacitor of the resonator is configured to allow a resistance value or a capacitance value thereof to be adjusted based on a third external signal.

According to the first embodiment, when the first switch is controlled to be on, the output of the resonator is connected to the input of the resonator in a positive feedback fashion, and the resonant filter oscillates. At least one of the resistance value of the resonator and the capacitance value of the capacitor is configured to be adjustable based on the third external signal. As a result, by adding the feedback path (small-scale additional circuit) including the feedback resistor and the first switch to the resonant filter, at least one of the resistance value of the resonator and the capacitance value of the capacitor is adjusted with high accuracy. Therefore, the values of the resistor and the capacitor included in the resonator can be adjusted with high accuracy using the small-scale additional circuit. Note that the third external signal may, for example, be generated by obtaining the product (RC product) of the values of the resistor and the capacitor based on an oscillation period of the resonant filter when the first switch is controlled to be on. In semiconductor devices, adjacent circuits often have similar tendency of manufacturing variations etc., and the values of a resistor and a capacitor (excluding a resonator) included in the delta-sigma A/D converter may be configured to be adjustable based on the third external signal.

In a second embodiment of the present disclosure, the delta-sigma A/D converter of the first embodiment further includes a controller configured to control the first switch based on the first external signal so that the first switch is on, measure, from an output signal of the quantizer, an oscillation period of the resonant filter which is in an oscillation state, obtain the product of the resistance value and the capacitance value based on the result of the measurement, and generate the third external signal based on the obtained product. A semiconductor device includes an RC circuit including a resistor and a capacitor and configured to allow characteristics thereof to be determined based on the product of a resistance value of the resistor and a capacitance value of the capacitor, and the above delta-sigma A/D converter configured to receive an output signal of the RC circuit as the first input signal. At least one of the resistance value of the resistor and the capacitance value of the capacitor, of the RC circuit, is adjusted based on the third external signal from the controller.

According to the second embodiment, in the semiconductor device, at least one of the resistance value of the resistor and the capacitance value of the capacitor, of the RC circuit, can also be adjusted based on the third external signal. Here, in semiconductor devices, adjacent circuits often have similar tendency of manufacturing variations etc., and the values of resistors and capacitors included in adjacent circuits often have similar tendency of variations in characteristics. Therefore, the RC circuit can also be adjusted with high accuracy.

A resonant filter according to a third embodiment includes a resonator including a resistor and a capacitance and configured to receive an input signal, and a feedback path configured to connect an output of the resonator to an input of the resonator, in a positive feedback fashion, through a first switch configured to be switched on and off based on a first external signal, and a feedback resistor configured to allow a resistance value thereof to be controlled based on a second external signal. The resonant filter operates as an oscillator when the first switch is controlled to be on and therefore the output of the resonator is positively fed back to the input of the resonator through the feedback path, and as a filter when the first switch is controlled to be off to open the feedback path. At least one of the resistor and the capacitor of the resonator is configured to allow a resistance value or a capacitance value thereof to be adjusted based on a third external signal.

According to the third embodiment, as in the first embodiment, the values of the resistor and the capacitor included in the resonator of the resonant filter can be adjusted with high accuracy using a small-scale additional circuit. Note that the third external signal may, for example, be generated by obtaining the product (RC product) of the values of the resistor and the capacitor based on an oscillation period of the resonant filter when the first switch is controlled to be on. The values of a resistor and a capacitor (excluding a resonator) included in the resonant filter may be configured to be adjustable based on the third external signal.

According to the present disclosure, the values of a resistor and a capacitor included in a resonant filter can be adjusted with high accuracy using a small-scale additional circuit. Also, in a delta-sigma A/D converter including a resonant filter, the values of a resistor and a capacitor included in the delta-sigma A/D converter can be adjusted with high accuracy using a small-scale additional circuit. As a result, the stability and signal-to-noise ratio characteristics of the delta-sigma A/D converter can be improved.

DETAILED DESCRIPTION

Figure 1:
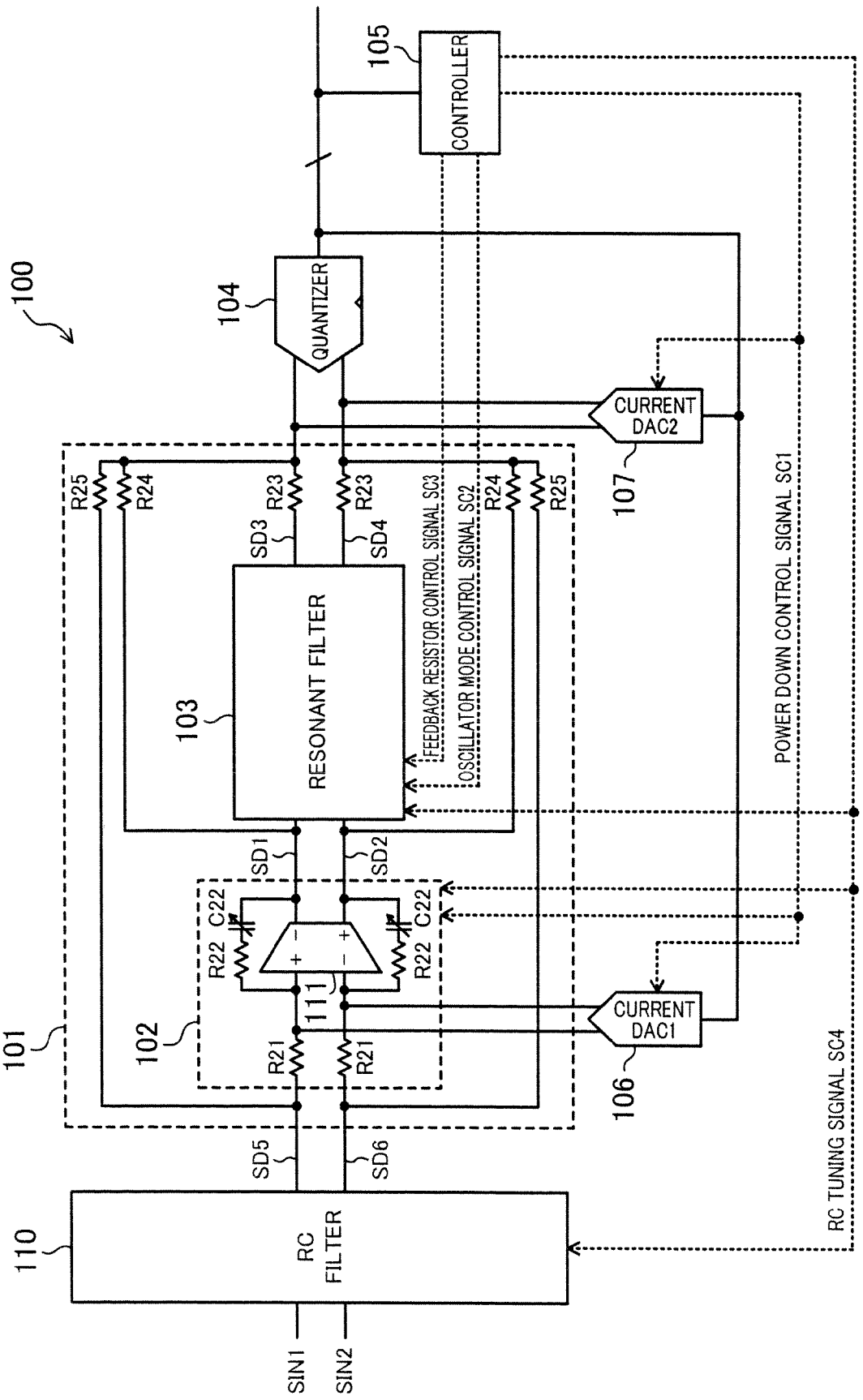
FIG. 1 is a diagram showing an example configuration of a semiconductor device according to a first embodiment.

Embodiments of the present disclosure will now be described in detail with reference to the accompanying drawings. Note that components common to the embodiments below are indicated by the same reference characters and will not be redundantly described in detail.

First Embodiment

FIG. 1 is a diagram showing an example configuration of a semiconductor device according to a first embodiment. In FIG. 1, the semiconductor device includes an RC filter 110 as an RC circuit which receives differential input signals SIN1 and SIN2, and a delta-sigma A/D converter 100 which is connected to a stage following the RC filter 110.

The delta-sigma A/D converter 100 includes a loop filter 101, a quantizer 104, current-drive feedback D/A converters 106 and 107 (described as "CURRENT DAC1" and "CURRENT DAC2" in FIG. 1), and a controller 105. The loop filter 101 includes an integrator 102 and a resonant filter 103.

Specifically, the RC filter 110 have differential outputs which are connected to respective corresponding nodes SD5 and SD6 which are each connected to one end of a corresponding one of resistors R21 of the integrator 102. The RC filter 110 supplies differential signals SD5 and SD6 as a first input signal to the respective corresponding resistors R21. Here, the differential signals passed through the nodes SD5 and SD6 are indicated by the same reference characters as those for the nodes SD5 and SD6.

The other end of each of the resistors R21 is connected to a corresponding one of differential inputs of an operational amplifier 111. The operational amplifier 111 has differential outputs which are connected to respective corresponding differential inputs of the resonant filter 103 by respective corresponding nodes SD1 and SD2. The operational amplifier 111 supplies differential signals SD1 and SD2 as a second input signal to the resonant filter 103. Here, the differential signals passed through the nodes SD1 and SD2 are indicated by the same reference characters as those for the nodes SD1 and SD2.

The differential outputs of the operational amplifier 111 are fed back to the respective corresponding differential inputs of the operational amplifier 111 through respective corresponding sets of a variable capacitor C22 and a resistor R22 which are connected together in series.

The resonant filter 103 has differential outputs which are connected to respective corresponding nodes SD3 and SD4 which are connected to respective corresponding inputs of the quantizer 104 through respective corresponding resistors R23. Differential signals input to the quantizer 104 are fed back to respective corresponding inputs of the integrator 102 through respective corresponding resistors R25. Similarly, the differential signals input to the quantizer 104 are fed back to respective corresponding inputs of the resonant filter 103 through respective corresponding resistors R24.

The quantizer 104 converts the differential input signals into a digital value. The digital value obtained by the conversion is output to the controller 105, and is also fed back through feedback D/A converters 106 and 107 as analog signals to respective corresponding inputs of the loop filter 101 and the respective corresponding inputs of the quantizer 104.

The controller 105 outputs a power down control signal SC1, an oscillator mode control signal SC2, a feedback resistor control signal SC3, and an RC tuning signal SC4 described below to control the integrator 102, the resonant filter 103, the feedback D/A converters 106 and 107, and the RC filter 110.

Figure 2:
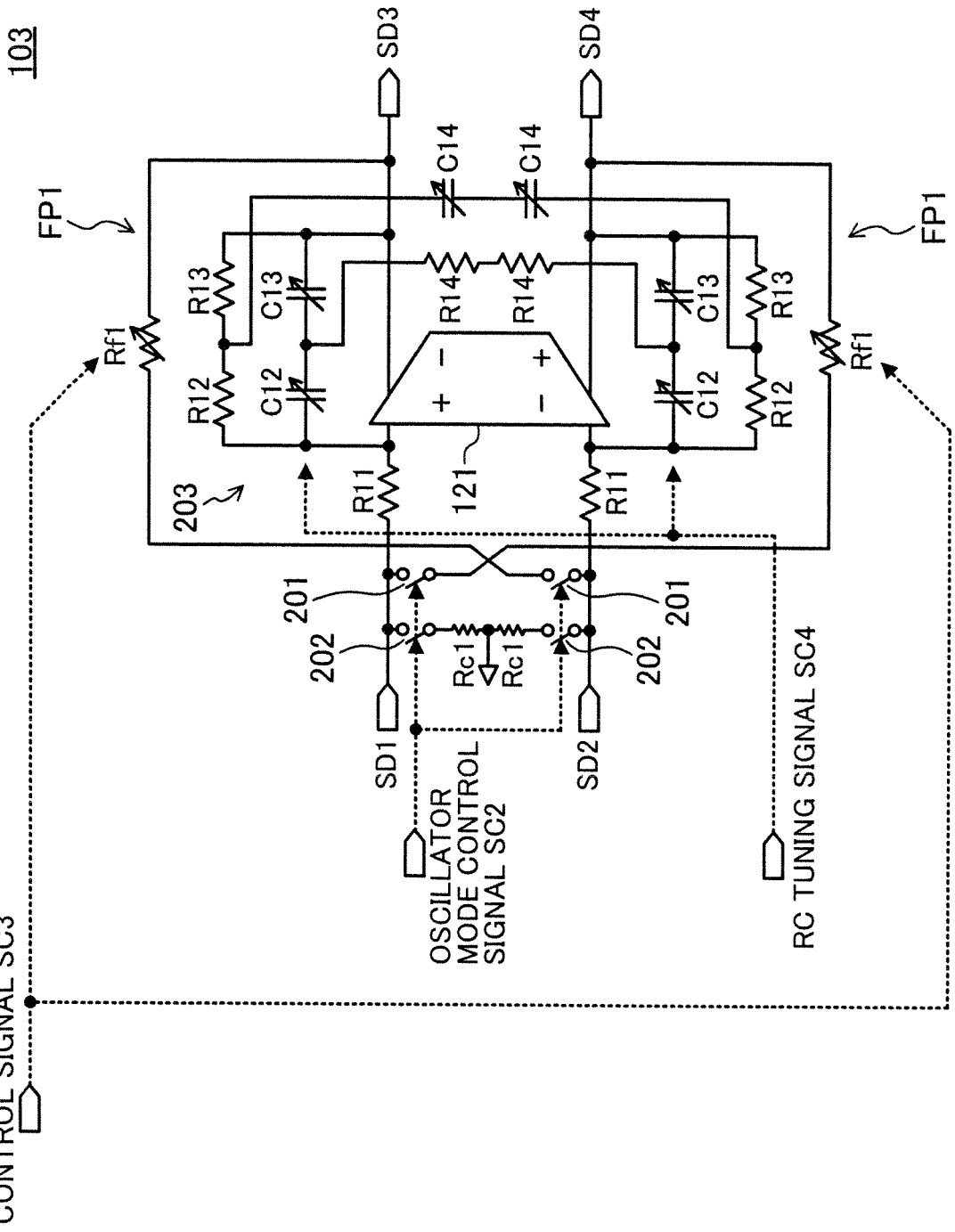
FIG. 2 is a diagram showing an example circuit configuration of a resonant filter according to the first embodiment.

FIG. 2 is a diagram showing an example circuit configuration of the resonant filter 103 in a case where the resonant filter 103 includes a single operational amplifier. In FIG. 2, the resonant filter 103 includes a resonator 203 including an operational amplifier 121 (a configuration of FIG. 4 described below) and feedback paths FP1.

The operational amplifier 121 has differential inputs which are connected to the respective corresponding nodes SD1 and SD2 through respective corresponding resistors R11. Note that capacitors may be used instead of the resistors R11.

The operational amplifier 121 has differential outputs which are connected to the respective corresponding nodes SD3 and SD4. The differential outputs of the operational amplifier 121 are negatively fed back (negative feedback) to the respective corresponding differential inputs of the operational amplifier 121 through respective corresponding sets of variable capacitors C13 and C12 which are connected together in series. Two sets of resistors R12 and R13 which are connected together in series are connected in parallel to the respective corresponding sets of the variable capacitors C12 and C13 connected together in series. Two resistors R14 are connected together in series between a node between the variable capacitors C12 and C13 in one of the sets and a node between the variable capacitors C12 and C13 in the other set. Similarly, two variable capacitors C14 are connected together in series between a node between the resistors R12 and R13 in one of the sets and a node between the resistors R12 and R13 in the other set. Although, in this embodiment, the two resistors R14 are connected together in series while the two variable capacitors C14 are connected together in series, the two resistors and the two capacitors may be replaced with a single resistor and a single capacitor, respectively.

The differential outputs of the operational amplifier 121 are also connected to the respective corresponding nodes SD1 and SD2 through respective corresponding feedback resistors Rf1 and first switches 201 in the respective corresponding feedback paths FP1. Here, the feedback paths FP1 are connected to the differential inputs of the operational amplifier 121 so that when the first switches 201 are controlled based on the oscillator mode control signal SC2 to be on and thereby cause a short circuit, the differential outputs of the operational amplifier 121 are positively fed back (positive feedback) to the differential inputs of the operational amplifier 121. A second switch 202, and a resistor Rc1 as a first resistor, are connected together in series between the node SD1 and the ground and between the node SD2 and the ground.

During normal operation, the first and second switches 201 and 202 are controlled based on the oscillator mode control signal SC2 to be both off, i.e., open.

[Adjustment of Capacitance Value]

Adjustment of the capacitance values of the variable capacitors C12, C13, and C14 of the resonant filter 103 will be specifically described with reference to FIGS. 1 and 2.

In FIG. 1, initially, the controller 105 powers down, i.e., stop driving, the feedback D/A converters 106 and 107 and the integrator 102 based on the power down control signal SC1. In this embodiment, for the integrator 102, the operational amplifier 111 is powered down. As a result, the nodes SD1 and SD2 go to the high-impedance state.

Next, the controller 105 controls the first and second switches 201 and 202 based on the oscillator mode control signal SC2 so that the first and second switches 201 and 202 are both switched on to cause a short circuit. At this time, the differential output signals of the operational amplifier 121 are positively fed back to the differential inputs of the operational amplifier 121 through the feedback resistors Rf1 and the first switches 201. The voltages of the positive-feedback differential signals are divided by the feedback resistors Rf1 and the resistors Rc1, and the resultant signals are supplied through the resistors R11 to the differential inputs of the operational amplifier 121. Thus, the resonant filter 103 is caused to function as an oscillator (hereinafter referred to as an "oscillator mode") by controlling the first and second switches 201 and 202 based on the oscillator mode control signal SC2 so that the first and second switches 201 and 202 are on.

Figure 3A:
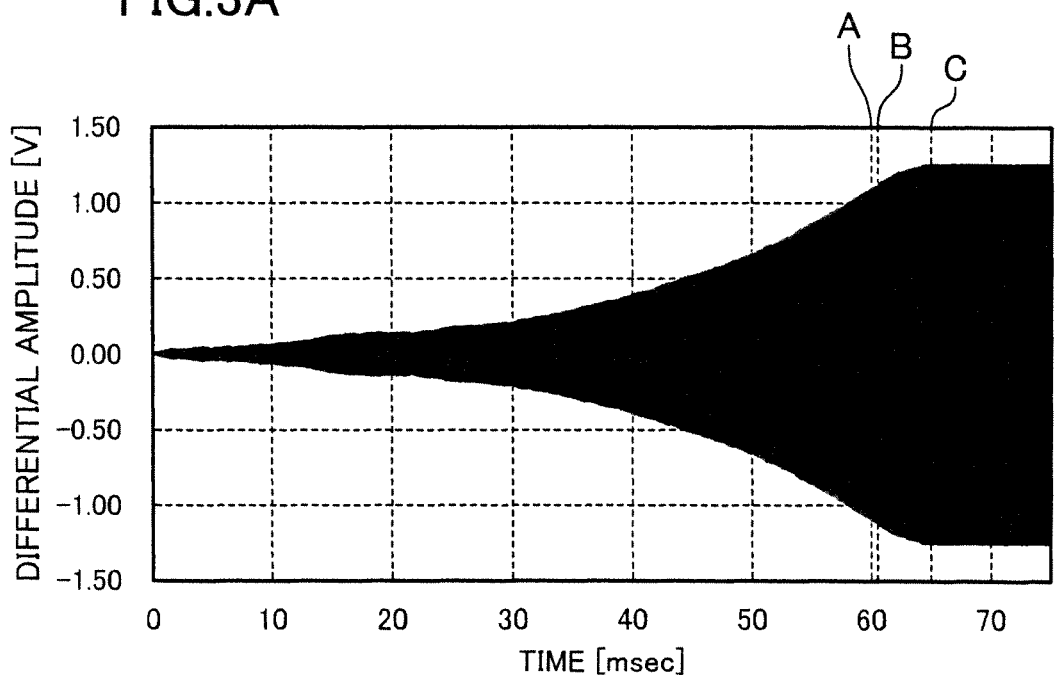
FIGS. 3A and 3B are diagrams showing example output waveforms of the resonant filter in the oscillator mode.
Figure 3B:
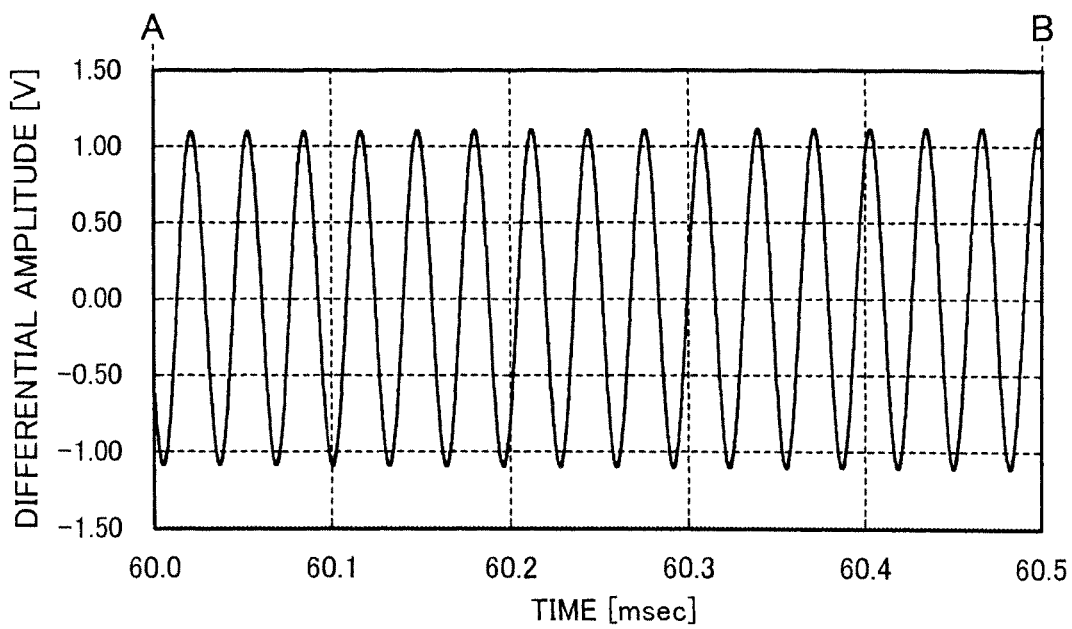

FIGS. 3A and 3B are diagrams showing example oscillating operation of the resonant filter 103 in the oscillator mode. Here, FIG. 3B is an enlarged view of a portion between A and B of FIG. 3A. In FIG. 3A, the resonant filter 103 is in a stable state in which the resonant filter 103 oscillates with a constant amplitude after about 65 msec has passed (point C).

Next, the controller 105 sets the resistance values of both the feedback resistors Rf1 to, for example, a maximum value based on the feedback resistor control signal SC3. Here, if the resistance value of the feedback resistor Rf1 is greater than or equal to a predetermined value, the amplitude of the feedback voltage obtained by voltage division performed by the feedback resistor Rf1 and the resistor Rc1 is small, and therefore, the resonant filter 103 does not oscillate. Therefore, here, the maximum resistance value of the feedback resistor Rf1 is previously set to a resistance value which does not cause the resonant filter 103 to oscillate. The controller 105 measures the output of the resonant filter 103 while decreasing the resistance value of the feedback resistor Rf1 from the maximum value based on the feedback resistor control signal SC3. Specifically, for example, for the set resistance value, after a predetermined time has passed which is long enough to cause the oscillation to be stable, the controller 105 measures the amplitude and period of the output of the resonant filter 103 based on the digital signal obtained from the quantizer 104. When the measured amplitude has become greater than or equal to a predetermined reference amplitude value and the measured period has fallen within a reference period range, it is determined that the resonant filter 103 is in the oscillation state, and the period at this time is determined to be the oscillation period of the resonant filter 103 in the oscillator mode. Here, the reference period range is set, taking into consideration, for example, the allowable ranges of the resistance value and the capacitance value which satisfy required A/D conversion characteristics, variations in the period calculated from manufacturing variations of the resistor and the capacitor, etc. The reference amplitude value is set to, for example, an amplitude which is ½ of the amplitude of the power supply. Note that the reference amplitude value is not limited to ½ of the amplitude of the power supply. The reference amplitude value may be set to be greater or smaller than ½ of the amplitude of the power supply, i.e., may be set to any amplitude value that causes the resonant filter 103 to oscillate. Note that either when the measured amplitude is greater than or equal to the predetermined reference amplitude value or when the measured period falls within the reference period range, it may be determined that the resonant filter 103 is in the oscillation state.

Next, the controller 105 determines the RC products of the variable capacitors C12 and C13 and the resistors R12 and R13 from the determined oscillation period of the resonant filter 103. The controller 105 also adjusts the capacitance values of the variable capacitors C12, C13, and C14 of the resonant filter 103 based on the RC tuning signal SC4 so that the RC products approach predetermined design values.

After the end of the adjustment, the controller 105 stops powering down the feedback D/A converters 106 and 107 and the integrator 102 based on the power down control signal SC1, and controls the first and second switches 201 and 202 based on the oscillator mode control signal SC2 so that the first and second switches 201 and 202 are switched off, and goes to the normal operation.

The above adjustment of the capacitance value is, for example, performed when the semiconductor device is turned on. The present disclosure is not limited to this. Alternatively, the capacitance adjustment may be regularly performed, for example, when no signal is being input.

Although, in the foregoing, the adjustment of the capacitance value is started with the feedback resistor Rf1 being set to the maximum value, the present disclosure is not limited to this. Alternatively, the adjustment of the capacitance value may be started with the feedback resistor Rf1 being set to a different resistance value.

In the adjustment of the capacitance value, the amplitude and period of the output of the resonant filter 103 may be measured while adjusting the resistor Rc1 instead of the feedback resistor Rf1.

[Filtering Operation (during Normal Operation) of Resonant Filter]

Figure 4:
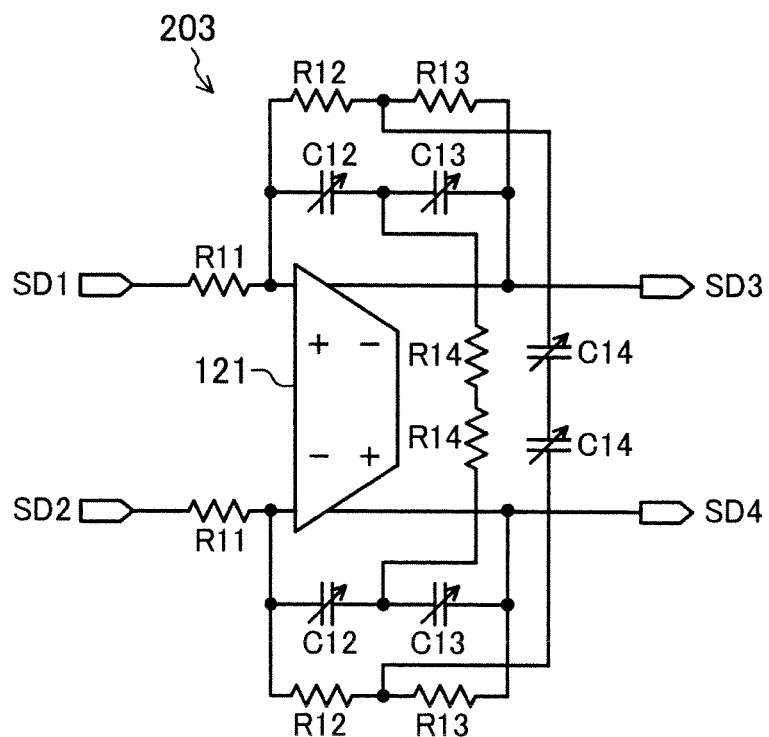
FIG. 4 is a diagram for describing example operation of the resonant filter (including a single operational amplifier) during normal operation.

FIG. 4 is a diagram for describing example operation of the resonant filter (including a single operational amplifier) during normal operation. Note that, during normal operation, the first and second switches 201 and 202 are controlled to be off, i.e., open, and therefore, in FIG. 4, the first and second switches 201 and 202, and the nodes to which the first and second switches 201 and 202 are connected, are not shown. Note that the configuration of FIG. 4 is the resonator 203 of this embodiment.

In the resonant filter 103 of FIG. 4, the transfer function of the resonant filter 103 may be calculated by Expression 2 below if a condition represented by Expression 1 below is satisfied. In the description that follows, for example, the resistance value of the resistor R11 is represented by $R_{11}$, and the capacitance value of the capacitor C11 is represented by $C_{11}$, and the same applies to the resistance and capacitance values of other resistors and capacitors in addition to the resistor R11 and the capacitor C11.

$$R_{14} = \frac{R_{12}R_{13}}{R_{12}+R_{13}}, C_{14} = C_{12} + C_{13} \quad (1)$$

$$H = \frac{R_{12}R_{13}}{R_{11}R_{14}} \cdot \frac{R_{14}C_{14}s + 1}{R_{12}R_{13}C_{12}C_{13}s^2 + 1} \quad (2)$$

A resonant frequency $fc$ in this case may be calculated by:

$$fc = \frac{1}{2\pi\sqrt{R_{12}R_{13}C_{12}C_{13}}} \quad (3)$$

Figure 5:
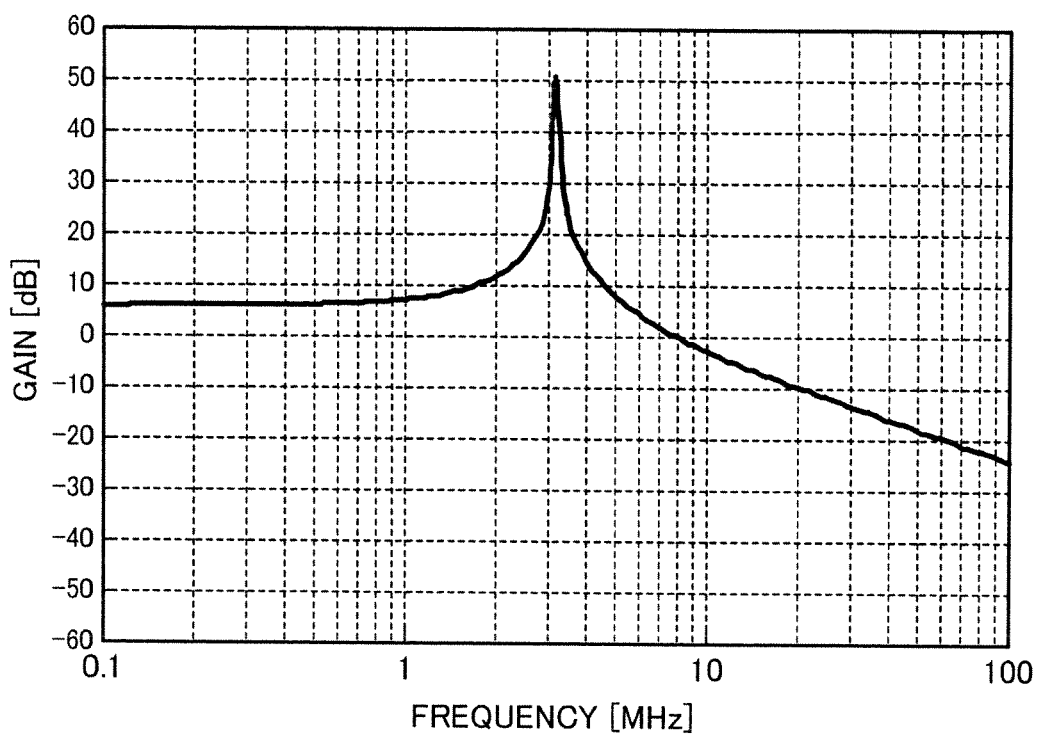
FIG. 5 is a diagram showing gain frequency characteristics of the resonant filter (including a single operational amplifier) during normal operation.

FIG. 5 is a diagram showing gain frequency characteristics which are obtained when the passive elements of FIG. 4 have the following values: $R_{11}$=200 kΩ, $R_{12}$=100 kΩ, $R_{13}$=100 kΩ, $R_{14}$=500 kΩ, $C_{12}$=500 fF, $C_{13}$=500 fF, and $C_{14}$=1 pF.

In FIG. 5, the resonant frequency fc is 3.183 MHz.

Note that the controller 105 may adjust the capacitance values of the variable capacitors C12, C13, and C14, for example, based on a difference between a period based on the resonant frequency of Expression 3 and a measured period of the resonant filter. Here, the variable capacitor C14 is, for example, adjusted so that $C_{14}=C_{12}+C_{13}$ under resonance conditions.

As described above, according to this embodiment, the capacitance values of the variable capacitors C12, C13, and C14 included in the resonant filter 103 can be adjusted with high accuracy using a small-scale additional circuit without using an RC oscillator. Here, the controller 105 is a digital circuit, and the circuit scale thereof can be reduced compared to when an RC oscillator is included.

Note that, instead of adjusting the capacitance values of the variable capacitors C12, C13, and C14, the resistance values of the resistors R11, R12, R13, and R14 may be adjusted, and even in this case, similar advantage are obtained. Alternatively, the values of the resistors R11, R12, R13, and R14 and the values of the variable capacitors C12, C13, and C14 may both be adjusted.

In the semiconductor device, the values of resistors and capacitors included in adjacent circuits often have similar tendency of variations in characteristics. Therefore, for example, the variable capacitor C22 and the resistor R22 of the integrator 102 may be adjusted based on the RC tuning signal SC4 using the RC product. The values of a resistor and a capacitor included in the RC filter 110 may also be adjusted.

The resonant filter 103 is not limited to the configuration of FIG. 2. In variations below of the circuit configuration of the resonant filter, an example in which passive elements have different configurations, and an example in which the resonant includes two filter operational amplifiers, will be described.

(First Variation of Circuit Configuration of Resonant Filter)

Figure 6:
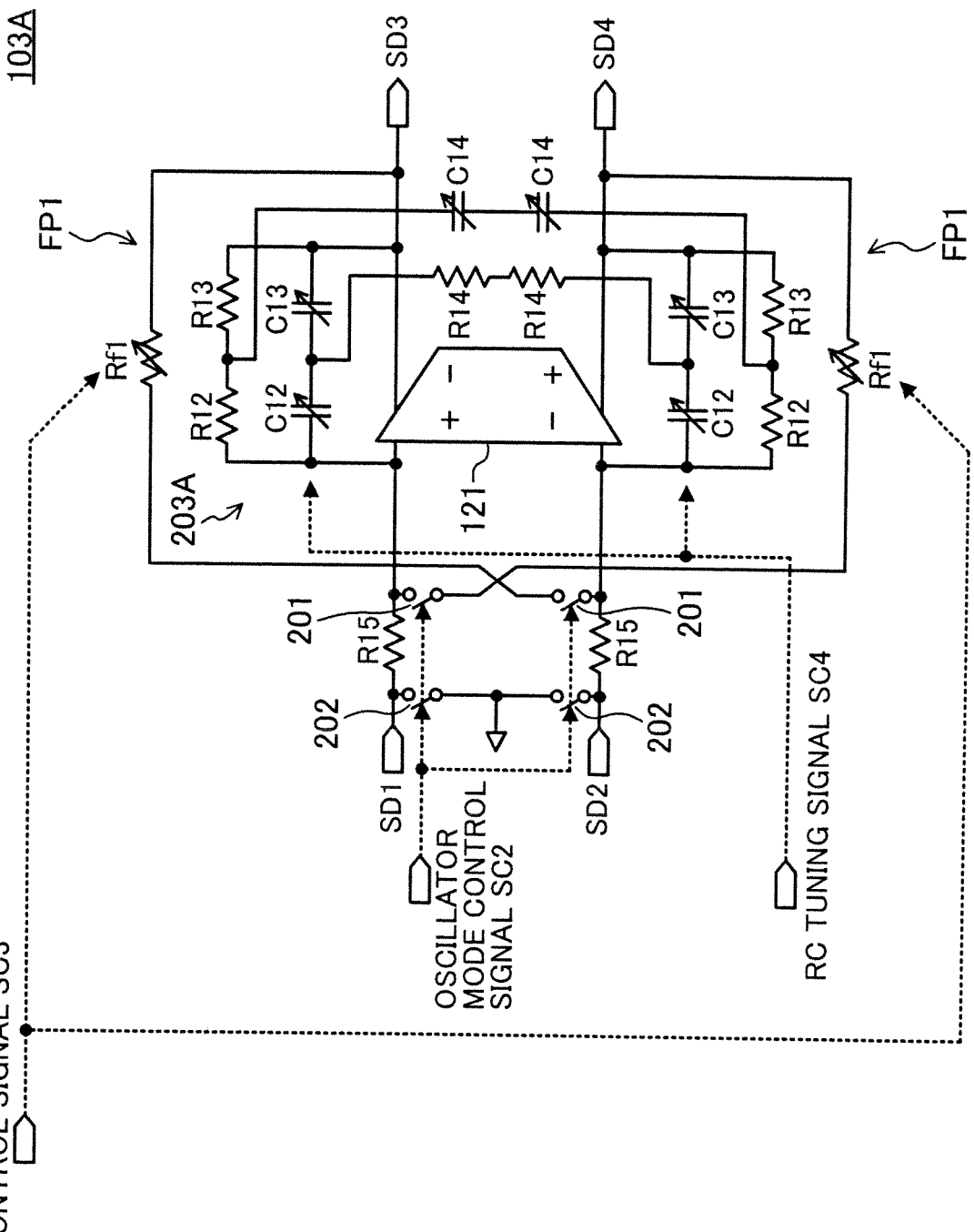
FIG. 6 is a diagram showing a first variation of the circuit configuration of the resonant filter.

FIG. 6 is a diagram showing a first variation of the circuit configuration of the resonant filter. The resonant filter 103A of FIG. 6 is different from that of FIG. 2 in which a resistor R15 as a first resistor is provided in the resonator 203A between each of the nodes SD1 and SD2 and the operational amplifier 121, i.e., between the first switches 201 and the second switches 202. Also, in FIG. 6, the resistor R11 and the resistor Rc1 are removed.

In the resonant filter 103A of FIG. 6, the resistor R15 functions as both the resistor R11 and the resistor Rc1. Specifically, in the oscillator mode, the voltages of the differential output signals of the operational amplifier 121 are divided by the respective corresponding feedback resistors Rf1 and resistors R15 in the respective corresponding feedback paths FP1, and are positively fed back to the inputs of the operational amplifier 121. The other parts are similar to those of FIG. 2 and will not be here described in detail. In FIG. 1, if the resonant filter 103A of FIG. 6 may be connected instead of the resonant filter 103 of FIG. 2, adjustment similar to that described in the above section [Adjustment of Capacitance Value] may be performed.

(Second Variation of Circuit Configuration of Resonant Filter)

Figure 7:
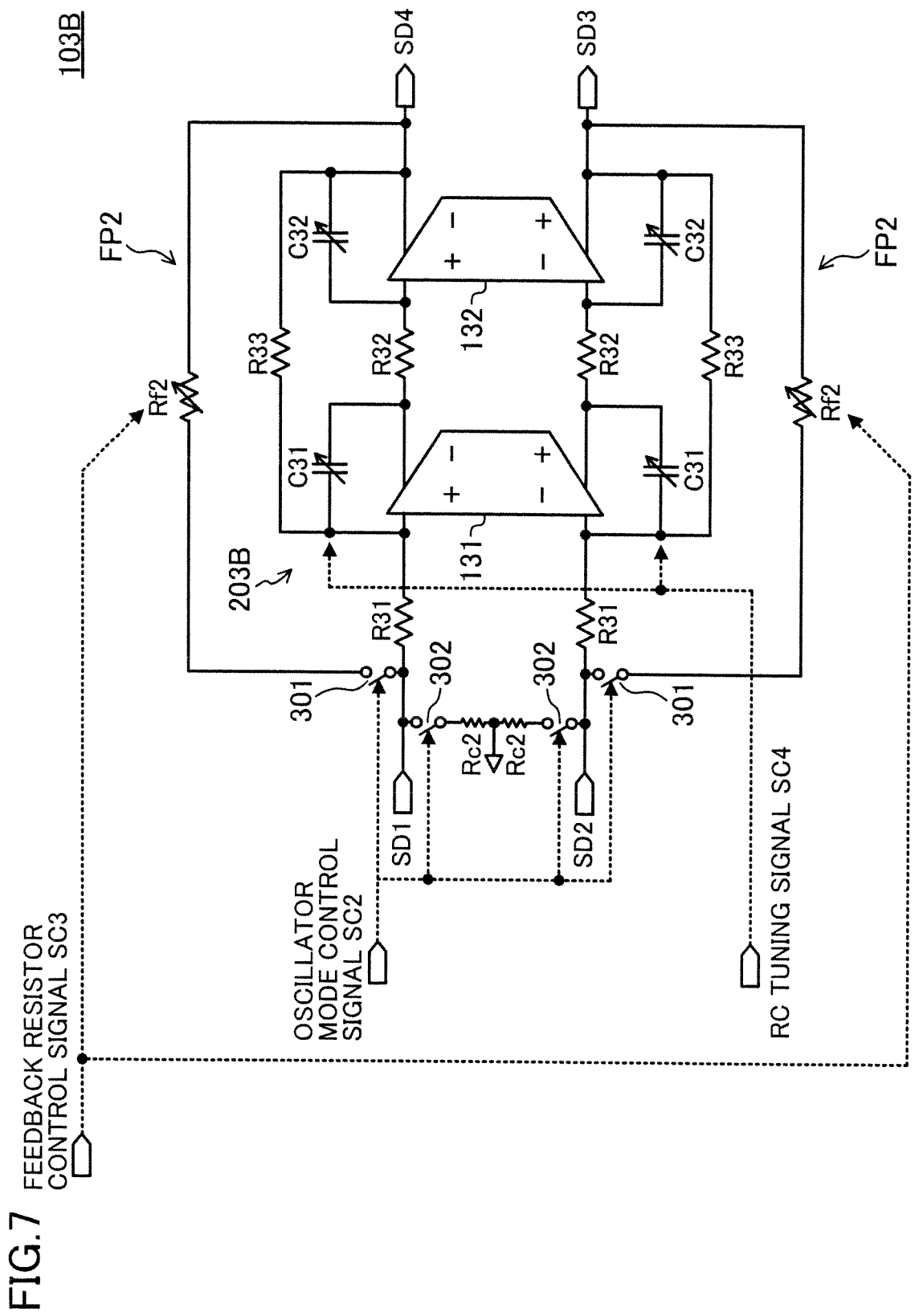
FIG. 7 is a diagram showing a second variation of the circuit configuration of the resonant filter (including two operational amplifiers).

FIG. 7 is a diagram showing a second variation of the circuit configuration of the resonant filter. The resonant filter 103B of FIG. 7 is different from that of FIG. 2 in which a resonator 203B (a configuration of FIG. 8 below) includes two operational amplifiers 131 and 132.

Specifically, the operational amplifier 131 has differential inputs which are connected to the nodes SD1 and SD2 through respective corresponding resistors R31. The operational amplifier 131 has differential outputs which are connected to respective corresponding differential inputs of the operational amplifier 132 through respective corresponding resistors R32. The operational amplifier 132 has differential outputs which are connected to the respective corresponding nodes SD3 and SD4. Here, in FIG. 7, compared to FIG. 2, the vertical positions of the nodes SD3 and SD4 are reversed. Note that capacitors may be used instead of the resistors R31.

The differential outputs of the operational amplifier 131 are negatively fed back to the respective corresponding differential inputs of the operational amplifier 131 through respective corresponding variable capacitor C31. The differential outputs of the operational amplifier 132 are negatively fed back to the respective corresponding differential inputs of the operational amplifier 132 through respective corresponding variable capacitor C32. The differential outputs of the operational amplifier 132 are negatively fed back to the respective corresponding differential inputs of the operational amplifier 131 through respective corresponding resistors R33.

The differential outputs of the operational amplifier 132 are connected to the nodes SD1 and SD2 through respective corresponding feedback resistors Rf2 and first switches 301 in respective corresponding feedback paths FP2. Here, when the first switch 301 is controlled based on the oscillator mode control signal SC2 to be switched on and thereby cause a short circuit, the differential outputs of the operational amplifier 132 are connected and positively fed back to the respective corresponding differential inputs of the operational amplifier 131 through the respective corresponding feedback resistors Rf2 and resistors R31. A second switch 302 and a resistor Rc2 as a first resistor are connected together in series between the node SD1 and the ground and between the node SD2 and the ground.

During normal operation, the first and second switches 301 and 302 are controlled based on the oscillator mode control signal SC2 to be off, i.e., open.

Note that, in FIG. 1, if the resonant filter 103B of FIG. 7 may be connected instead of the resonant filter 103 of FIG. 2, adjustment similar to that described in the above section [Adjustment of Capacitance Value] may be performed.

Even if the two resistors R31 and Rc2 of FIG. 7 may be replaced with a single resistor like the resistor R15 of FIG. 6, similar advantages are obtained.

[Filtering Operation (Normal Operation) of Resonant Filter]

Figure 8:
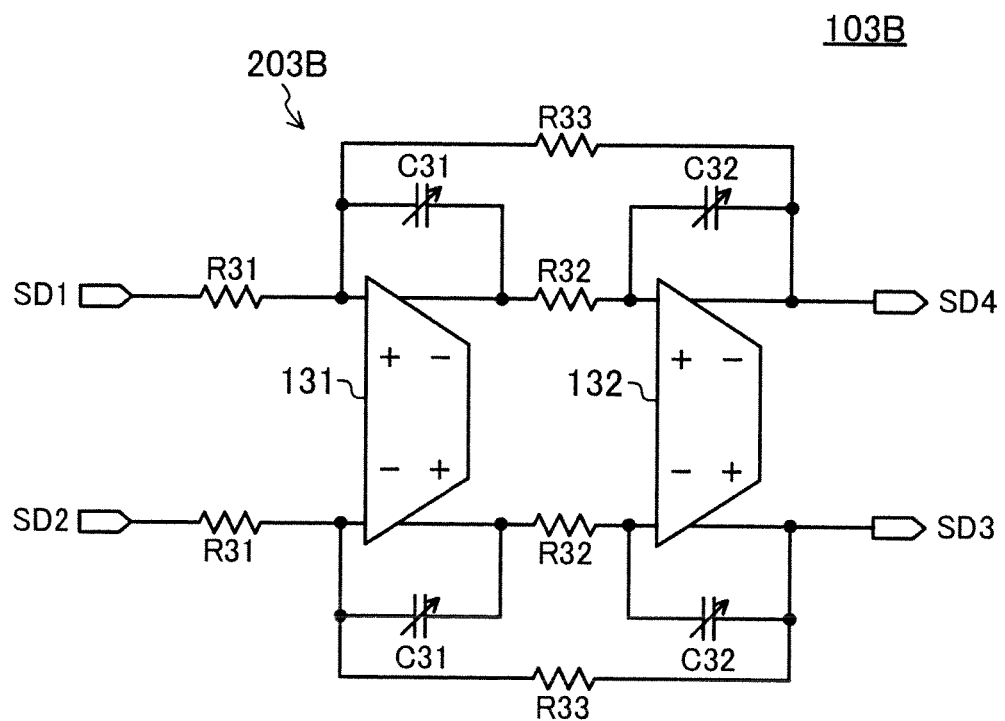
FIG. 8 is a diagram for describing example operation of the resonant filter (including two operational amplifiers) during normal operation.

FIG. 8 is a diagram for describing example operation of the resonant filter (including two operational amplifiers) of FIG. 7 during normal operation. During normal operation, both the first and second switches 301 and 302 are open, and therefore, in FIG. 8, the first and second switches 301 and 302, and the nodes to which the first and second switches 301 and 302 are connected, are not shown. Note that the configuration of FIG. 8 is the resonator 203B of the second variation of the circuit configuration.

In the resonant filter 103B of FIG. 8, the transfer function of the resonant filter 103B may be obtained by:

$$H = \frac{R_{33}}{R_{31}} \cdot \frac{1}{R_{32}R_{33}C_{31}C_{32}s^2 + 1} \quad (4)$$

The resonant frequency fc in this case may be calculated by:

$$fc = \frac{1}{2\pi\sqrt{R_{32}R_{33}C_{31}C_{32}}} \quad (5)$$

Figure 9:
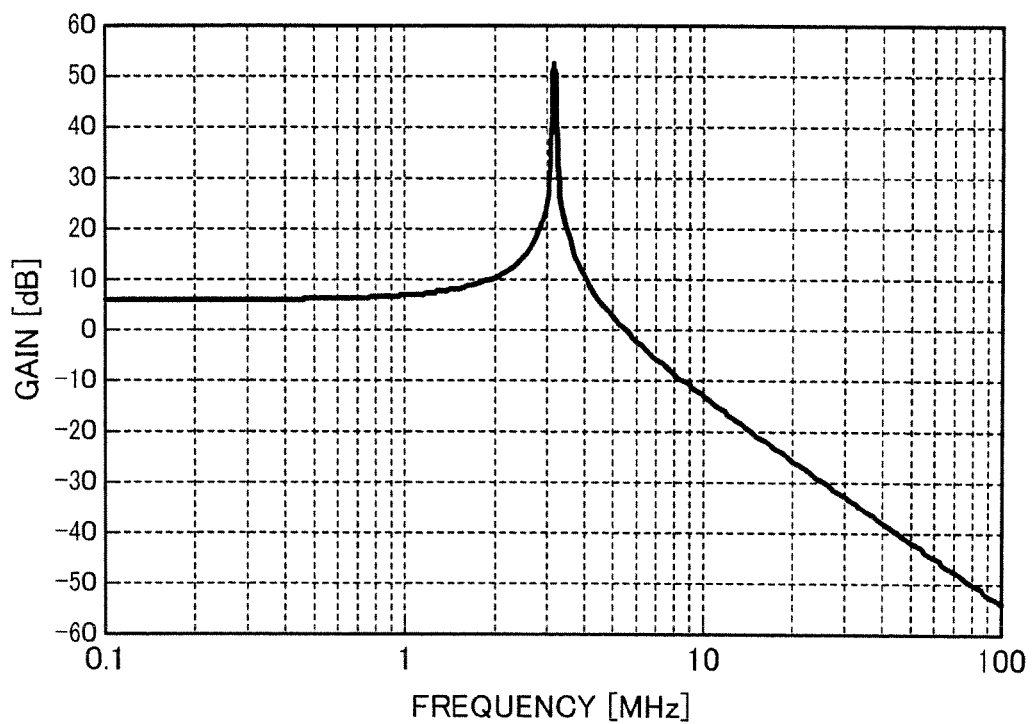
FIG. 9 is a diagram showing gain frequency characteristics of the resonant filter (including two operational amplifiers) during normal operation.

FIG. 9 is a diagram showing gain frequency characteristics which are obtained when the passive elements of FIG. 8 have the following values: $R_{31}$=100 kΩ, $R_{32}$=100 kΩ, $R_{33}$=100 kΩ, $C_{31}$=500 fF, and $C_{32}$=500 fF.

In FIG. 9, the resonant frequency is 3.183 MHz.

Note that the controller 105 may adjust the capacitance values of the variable capacitors C31 and C32, for example, based on a difference between a period based on the resonant frequency of Expression 5 and a measured period of the resonant filter.

As described above, even when a different passive element configuration is provided and when two operational amplifiers are provided, the value of a capacitor included in the resonant filter can be adjusted with high accuracy using a small-scale additional circuit.

Although, in the above example, two operational amplifiers are provided, three or more operational amplifiers may be provided, and even in this case, similar advantages can be obtained.

Even if the resistance values of the resistors R31, R32, and R33 may be adjusted instead of the capacitance values of the variable capacitors C31 and C32, similar advantages may be obtained. The values of the resistors R31, R32, and R33 and the values of the variable capacitors C31 and C32 may both be adjusted.

In the first embodiment, a single configuration may be used to obtain similar advantages. In a second embodiment, an example will be described in which the delta-sigma A/D converter 100 of FIG. 1 and the resonant filter 103 of FIG. 2 are integrated in a single circuit.

Second Embodiment

Figure 10:
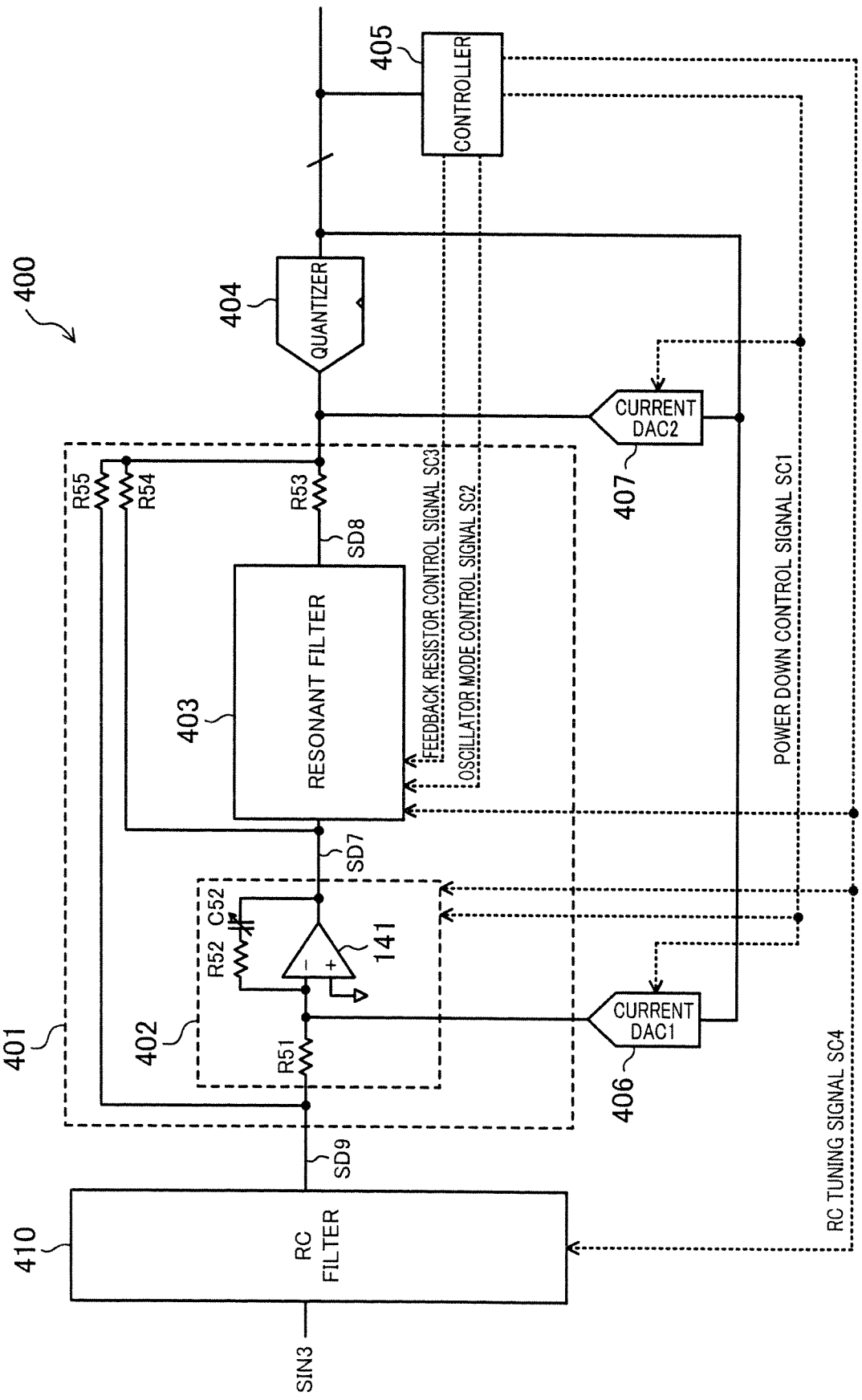
FIG. 10 is a diagram showing an example configuration of a semiconductor device according to a second embodiment.

FIG. 10 is a diagram showing an example configuration of a semiconductor device according to a second embodiment. In FIG. 10, the same parts as those of FIG. 1 are indicated by the same reference characters and will not be here described in detail.

In FIG. 10, the semiconductor device includes an RC filter 410 as an RC circuit which receives an input signal SIN3, and a delta-sigma A/D converter 400 which is connected to a stage following the RC filter 410.

The delta-sigma A/D converter 400 includes a loop filter 401, a quantizer 404, current-drive feedback D/A converters 406 and 407 (described as "CURRENT DAC1" and "CURRENT DAC2" in FIG. 10), and a controller 405. The loop filter 401 includes an integrator 402 and a resonant filter 403.

Specifically, the RC filter 410 has an output which is connected to a node SD9 which is connected to one end of a resistor R51 of the integrator 402. The RC filter 410 supplies a signal SD9 as a first input signal to the resistor R51. Here, the signal passed through the node SD9 is indicated by the same reference character as that for the node SD9.

The other end of the resistor R51 is connected to an inverted input of an operational amplifier 141. The operational amplifier 141 has an output which is connected to an input of the resonant filter 403 by a node SD7. The operational amplifier 141 has a non-inverted input which is grounded. The operational amplifier 141 supplies a signal SD7 as a second input signal to the resonant filter 403. Here, the signal passed through the node SD7 is indicated by the same reference character as that for the node SD7.

The output of the operational amplifier 141 is fed back to the inverted input terminal of the operational amplifier 141 through a variable capacitor C52 and a resistor R52 which are connected together in series.

The resonant filter 403 has an output which is connected to a node SD8 which is connected to an input of the quantizer 404 through a resistor R53. A signal input to the quantizer 404 is fed back to the input of the resonant filter 403 and an input of the integrator 402 through resistors R54 and R55, respectively.

A digital signal output from the quantizer 404 is output to the controller 405, and is also fed back through the feedback D/A converters 406 and 407 as analog signals to an input of the loop filter 401 and the input of the quantizer 404, respectively. The controller 405 performs a control similar to that of the controller 105 of FIG. 1 based on the power down control signal SC1, the oscillator mode control signal SC2, the feedback resistor control signal SC3, and the RC tuning signal SC4.

Figure 11:
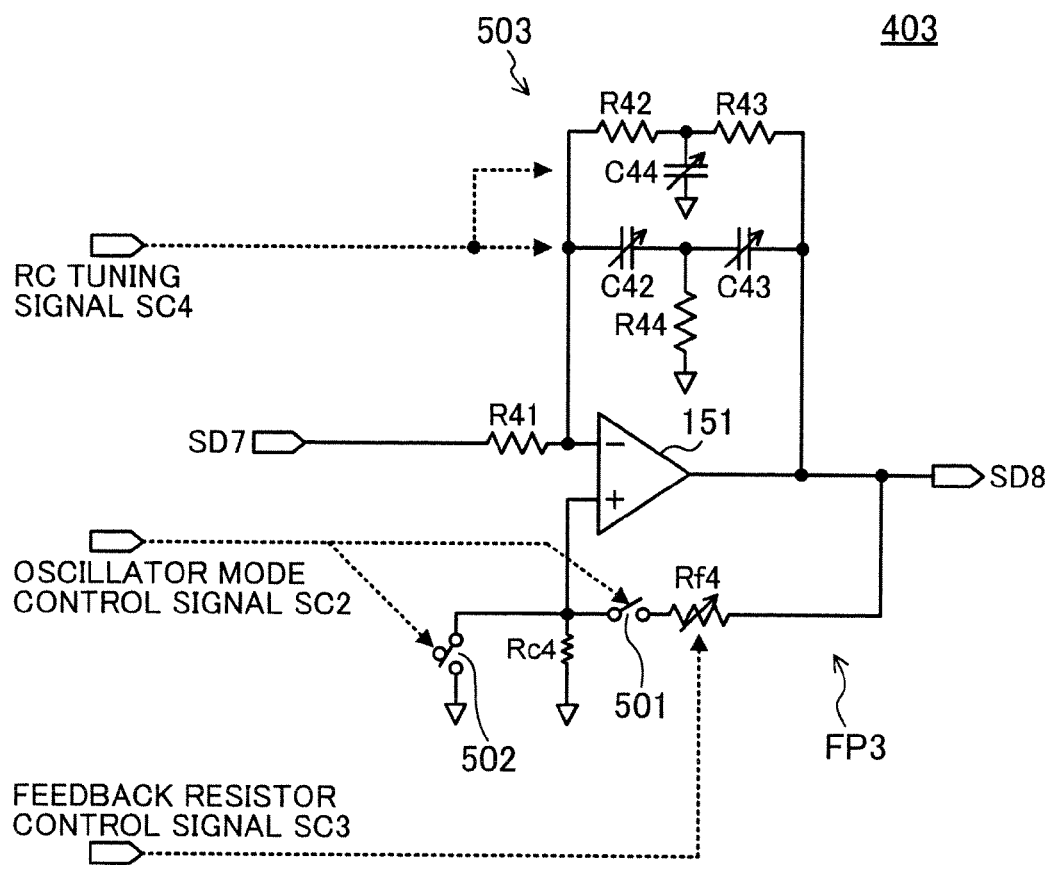
FIG. 11 is a diagram showing an example circuit configuration of a resonant filter according to the second embodiment.
Figure 12:
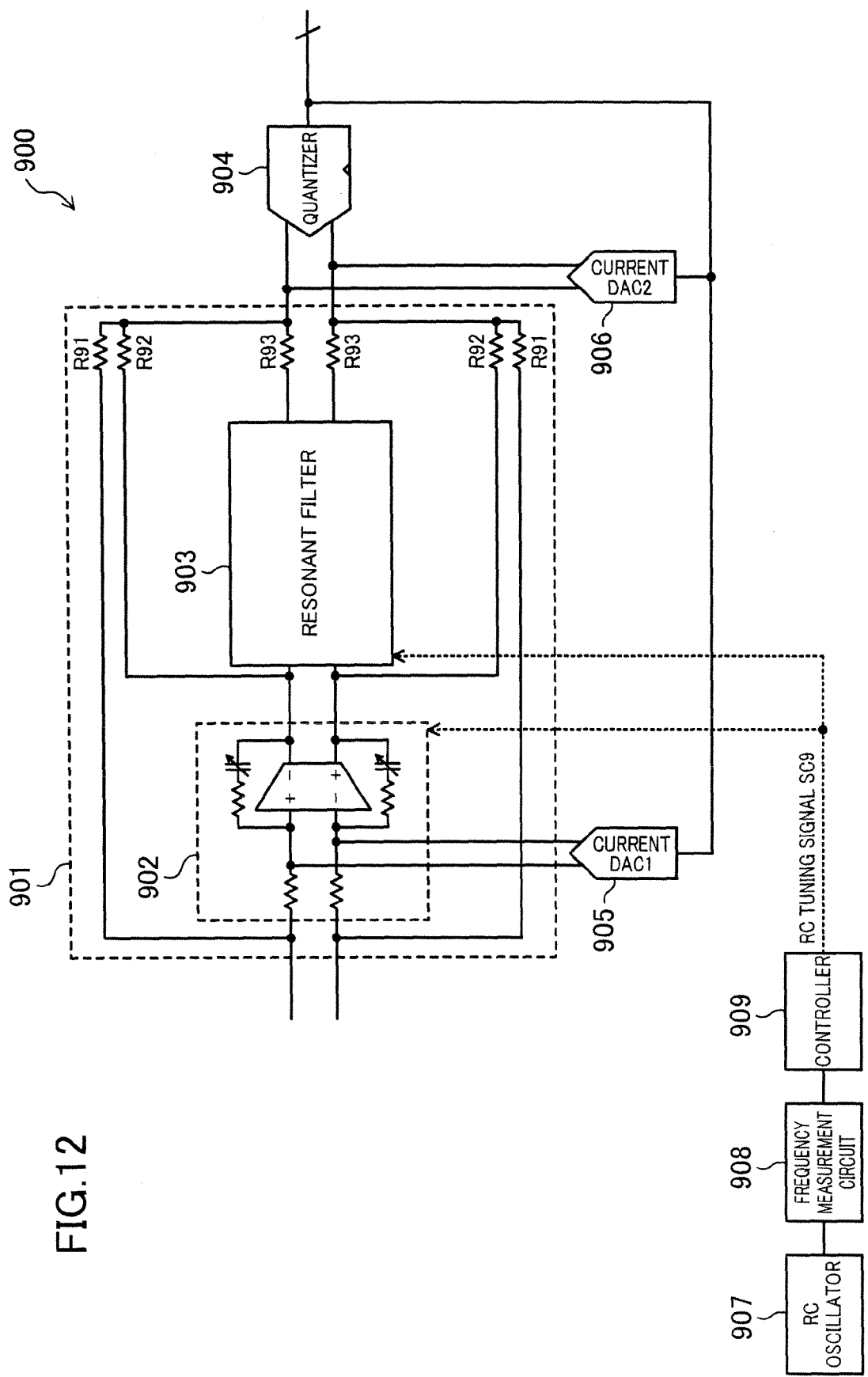
FIG. 12 is a diagram showing an example configuration of a conventional semiconductor device.

FIG. 11 is a diagram showing an example circuit configuration of the resonant filter 403 of this embodiment. In FIG. 11, the resonant filter 403 includes a resonator 503 including an operational amplifier 151, and a feedback path FP3. The operational amplifier 151 has an inverted input which is connected to the node SD7 through a resistor R41. The operational amplifier 151 has an output which is connected to the node SD8.

The output of the operational amplifier 151 is also negatively fed back to the inverted input of the operational amplifier 151 through variable capacitors C43 and C42 which are connected together in series. Resistors R42 and R43 which are connected together in series are connected in parallel to the variable capacitors C42 and C43 which are connected together in series. A node between the variable capacitors C42 and C43 is grounded through a resistor R44. A node between the resistors R42 and R43 is grounded through a variable capacitor C44.

The output of the operational amplifier 151 is also connected to a non-inverted input of the operational amplifier 151 through a feedback resistor Rf4 and a first switch 501 of the feedback path FP3. A resistor Rc4 as a first resistor and a second switch 502 are connected together in parallel between the non-inverted input of the operational amplifier 151 and the ground.

During normal operation, the first switch 501 is controlled based on the oscillator mode control signal SC2 to be switched off, i.e., opened. On the other hand, the second switch 502 is controlled based on the oscillator mode control signal SC2 to be switched on and thereby cause a short circuit between the non-inverted input of the operational amplifier 151 and the ground.

On the other hand, in the adjustment of a capacitance value (oscillator mode), the first switch 501 is controlled based on the oscillator mode control signal SC2 to be switched on and thereby cause a short circuit. On the other hand, the second switch 502 is controlled based on the oscillator mode control signal SC2 to be switched off and thereby disconnect between the non-inverted input and the ground. By the above control, the output of the operational amplifier 151 is positively fed back to the non-inverted input of the operational amplifier 151 through the feedback resistor Rf4. A feedback voltage obtained by voltage division performed by the feedback resistor Rf4 and the resistor Rc4 is supplied to the non-inverted input of the operational amplifier 151.

Note that if, during normal operation, noise occurring due to the connection of the resistor Rc4 is small enough to have substantially no influence on the operational amplifier 151, the switch 502 may be removed.

Here, the adjustment of a capacitance value is similar to that of the first embodiment and therefore will not be described in detail.

As described above, according to this embodiment, even in the semiconductor device having a single configuration, the capacitance values of the variable capacitors C42, C43, and C44 included in the resonant filter 403 can be adjusted with high accuracy using a small-scale additional circuit without using an RC oscillator.

Note that, also in this embodiment, instead of adjusting the capacitance values of the variable capacitors C42, C43, and C44, the resistance values of the resistors R41, R42, R43, and R44 may be adjusted, and even in this case, similar advantage are obtained. Alternatively, the values of the resistors R41, R42, R43, and R44 and the values of the variable capacitors C42, C43, and C44 may both be adjusted.

In the semiconductor device, the values of resistors and capacitors included in adjacent circuits often have similar tendency of variations in characteristics. Therefore, for example, the variable capacitor C52 and the resistor R52 of the integrator 402 may be adjusted based on the RC tuning signal SC4. The values of a resistor and a capacitor included in the RC filter 410 may also be adjusted.

Although, in the above embodiments, the resonant filter is assumed to be used in a delta-sigma A/D converter, the resonant filter may be used in other devices. For example, the resonant filter may be used as a filter for a wireless receiver. Also in this case, the resonant filter is caused to oscillate, the frequency characteristics (period) thereof are measured, the RC product thereof is obtained based on the result of the measurement, and the values of a resistor and a capacitor included therein are adjusted. When the resonant filter is applied to a wireless receiver, the resonant filter is caused to operate as a filter, as with a normal filter, after the wireless receiver has transitioned to normal operation.

In the above embodiments, the resonant filter of the loop filter may be configured to receive signals directly from the RC filter. In this case, the first and second input signals are the same.

In FIGS. 1 and 10, the feedback D/A converters 107 and 407 are not necessarily required and may be removed.

In a resonant filter and a delta-sigma modulator according to an embodiment of the present disclosure, the values of a resistor and a capacitor included therein can be adjusted with high accuracy using a small-scale additional circuit. Therefore, a resonant filter and a delta-sigma modulator according to an embodiment of the present disclosure are useful as a filter circuit for filtering a wireless reception signal, an A/D converter for processing a sensor signal, etc. in the fields of wireless receivers, audio, etc.

What is claimed is:

1. A delta-sigma A/D converter comprising:
    a loop filter including a resonant filter and configured to receive a first input signal;
    a quantizer configured to convert an output of the loop filter into a digital signal; and
    a feedback D/A converter configured to convert an output of the quantizer into an analog signal and feed back the analog signal to the loop filter,
wherein
    the resonant filter includes
        a resonator including a resistor and a capacitor and configured to receive a second input signal, and
        a feedback path configured to connect an output of the resonator to an input of the resonator, in a positive feedback fashion, through a first switch configured to be switched on and off based on a first external signal and a feedback resistor configured to allow a resistance value thereof to be controlled based on a second external signal,
    the resonant filter operates as an oscillator when the first switch is controlled to be on and therefore the output of the resonator is positively fed back to the input of the resonator through the feedback path, and as a filter when the first switch is controlled to be off and therefore the feedback path is open, and
    at least one of the resistor and the capacitor of the resonator is configured to allow a resistance value or a capacitance value thereof to be adjusted based on a third external signal.

2. The delta-sigma A/D converter of claim 1, wherein
    the resonant filter includes
        a first resistor connected between the feedback path and the ground, and
    when the first switch is controlled to be on, a voltage of the output of the resonator is divided by the feedback resistor and the first resistor, and is positively fed back to the input of the resonator.

3. The delta-sigma A/D converter of claim 1, wherein
    the resonator receives the second input signal through a first resistor, and
    when the first switch is controlled to be on, a voltage of the output of the resonator is divided by the feedback resistor and the first resistor, and is positively fed back to the input of the resonator.

4. The delta-sigma A/D converter of claim 1, further comprising:
    a controller configured to control the first switch based on the first external signal so that the first switch is on, measure, from an output signal of the quantizer, an oscillation period of the resonant filter which is in an oscillation state, obtain the product of the resistance value and the capacitance value based on the result of the measurement, and generate the third external signal based on the obtained product.

5. The delta-sigma A/D converter of claim 4, wherein
    the controller determines that the resonant filter is in the oscillation state, when an amplitude of an output signal of the resonant filter measured from the output signal of the quantizer is greater than or equal to a predetermined value.

6. The delta-sigma A/D converter of claim 4, wherein
    the controller determines that the resonant filter is in the oscillation state, when a period of an output signal of the resonant filter measured from the output signal of the quantizer is within a predetermined range.

7. The delta-sigma A/D converter of claim 4, wherein
    the loop filter further includes a resistor and a capacitor, and
    at least one of a resistance value of the resistor and a capacitance value of the capacitor is adjusted based on the third external signal from the controller.

8. A semiconductor device comprising:
    an RC circuit including a resistor and a capacitor and configured to allow characteristics thereof to be determined based on the product of a resistance value of the resistor and a capacitance value of the capacitor; and
    the delta-sigma A/D converter of claim 4 configured to receive an output signal of the RC circuit as the first input signal,
wherein
    at least one of the resistance value of the resistor and the capacitance value of the capacitor, of the RC circuit, is adjusted based on the third external signal from the controller.

9. A resonant filter comprising:
    a resonator including a resistor and a capacitance and configured to receive an input signal; and
    a feedback path configured to connect an output of the resonator to an input of the resonator, in a positive feedback fashion, through a first switch configured to be switched on and off based on a first external signal, and a feedback resistor configured to allow a resistance value thereof to be controlled based on a second external signal,
wherein
    the resonant filter operates as an oscillator when the first switch is controlled to be on and therefore the output of the resonator is positively fed back to the input of the resonator through the feedback path, and as a filter when the first switch is controlled to be off to open the feedback path, and
    at least one of the resistor and the capacitor of the resonator is configured to allow a resistance value or a capacitance value thereof to be adjusted based on a third external signal.

* * * * *